US010867678B2

(12) United States Patent
Chen et al.

(10) Patent No.: US 10,867,678 B2
(45) Date of Patent: Dec. 15, 2020

(54) THREE-DIMENSIONAL MEMORY DEVICES

(71) Applicant: YANGTZE MEMORY TECHNOLOGIES CO., LTD., Wuhan (CN)

(72) Inventors: Jun Chen, Wuhan (CN); Jifeng Zhu, Wuhan (CN); Zhenyu Lu, Wuhan (CN); Yushi Hu, Wuhan (CN); Jin Wen Dong, Wuhan (CN); Lan Yao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 26 days.

(21) Appl. No.: 16/137,656

(22) Filed: Sep. 21, 2018

(65) Prior Publication Data
US 2020/0027509 A1 Jan. 23, 2020

Related U.S. Application Data

(63) Continuation of application No. PCT/CN2018/096515, filed on Jul. 20, 2018.

(51) Int. Cl.
*H01L 27/11582* (2017.01)
*G11C 16/04* (2006.01)
(Continued)

(52) U.S. Cl.
CPC ...... *G11C 16/0483* (2013.01); *G11C 13/0069* (2013.01); *G11C 16/0466* (2013.01);
(Continued)

(58) Field of Classification Search
CPC .................................................. H01L 2924/00
(Continued)

(56) References Cited

U.S. PATENT DOCUMENTS 8,964,474 B2 * 2/2015 Morooka ............... G11C 16/06
365/185.17
10,522,489 B1 * 12/2019 Takiar .................... H01L 24/08
(Continued)

FOREIGN PATENT DOCUMENTS

CN 106910746 A 6/2017
CN 106920796 A 7/2017
(Continued)

OTHER PUBLICATIONS

International Search Report issued in corresponding International Application No. PCT/CN2018/096515, dated Apr. 24, 2019, 4 pages.
(Continued)

*Primary Examiner* — Min Huang
(74) *Attorney, Agent, or Firm* — Bayes PLLC

(57) ABSTRACT

Embodiments of three-dimensional (3D) memory devices are disclosed. In an example, a 3D memory device includes a substrate, a peripheral device disposed on the substrate, a memory stack disposed above the peripheral device and including a plurality of conductor/dielectric layer pairs, and a plurality of memory strings. Each of the memory strings extends vertically through the memory stack and includes a drain select gate and a source select gate above the drain select gate. Edges of the conductor/dielectric layer pairs in a staircase structure of the memory stack along a vertical direction away from the substrate are staggered laterally toward the memory strings.

19 Claims, 14 Drawing Sheets

(51) Int. Cl.
 *G11C 13/00* (2006.01)
 *H01L 25/065* (2006.01)
 *H01L 27/24* (2006.01)
(52) U.S. Cl.
 CPC ...... *H01L 25/0652* (2013.01); *H01L 25/0657* (2013.01); *H01L 27/2481* (2013.01)
(58) Field of Classification Search
 USPC .......................................................... 257/324
 See application file for complete search history.

(56) References Cited

U.S. PATENT DOCUMENTS

| 2011/0286283 | A1* | 11/2011 | Lung | G11C 16/0483 |
| | | | | 365/185.28 |
| 2015/0076585 | A1 | 3/2015 | Pachamuthu et al. | |
| 2015/0340366 | A1* | 11/2015 | Lim | G11C 5/025 |
| | | | | 257/401 |
| 2017/0179026 | A1* | 6/2017 | Toyama | H01L 27/11573 |
| 2017/0179027 | A1* | 6/2017 | Kim | H01L 25/072 |
| 2019/0035805 | A1* | 1/2019 | Lee | H01L 27/11582 |

FOREIGN PATENT DOCUMENTS

| CN | 107658315 A | 2/2018 |
| CN | 107887395 A | 4/2018 |
| TW | 201803092 A | 1/2018 |

OTHER PUBLICATIONS

Written Opinion of the International Searching Authority issued in corresponding International Application No. PCT/CN2018/096515, dated Apr. 24, 2019, 5 pages.

* cited by examiner

THREE-DIMENSIONAL MEMORY DEVICES

CROSS REFERENCE TO RELATED APPLICATION

This application is continuation of International Application No. PCT/CN2018/096515, filed on Jul. 20, 2018, entitled "THREE-DIMENSIONAL MEMORY DEVICES," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices are disclosed herein.

In one example, a 3D memory device includes a substrate, a peripheral device disposed on the substrate, a memory stack disposed above the peripheral device and including a plurality of conductor/dielectric layer pairs, and a plurality of memory strings. Each of the memory strings extends vertically through the memory stack and includes a drain select gate and a source select gate above the drain select gate. Edges of the conductor/dielectric layer pairs in a staircase structure of the memory stack along a vertical direction away from the substrate are staggered laterally toward the memory strings.

In another example, a 3D memory device includes a substrate, a peripheral device disposed on the substrate, a memory stack disposed above the peripheral device and including a plurality of conductor/dielectric layer pairs, a plurality of memory strings each extending vertically through the memory stack, a first interconnect layer disposed above the memory strings, a second interconnect layer disposed below the memory strings, a plurality of first via contacts, and a plurality of second via contacts. Each of the first via contacts includes a lower end in contact with a conductor layer in one of the conductor/dielectric layer pairs and an upper end in contact with the first interconnect layer. Each of the second via contacts includes a lower end in contact with the second interconnect layer and an upper end in contact with one of the memory strings.

In still another example, a 3D memory device includes a first semiconductor structure, a second semiconductor structure, and a bonding interface between the first and second semiconductor structures. The first semiconductor structure includes a plurality of memory strings each extending vertically and including a semiconductor plug at an upper end of the memory string, a first interconnect layer disposed above the memory strings, a second interconnect layer disposed below the memory strings, and a plurality of first via contacts. Each of the first via contacts includes a lower end in contact with one of the semiconductor plugs and an upper end in contact with the first interconnect layer. The second semiconductor structure includes a substrate, a peripheral device disposed on the substrate, and a third interconnect layer disposed above the peripheral device. The second interconnect layer contacts the third interconnect layer at the bonding interface.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
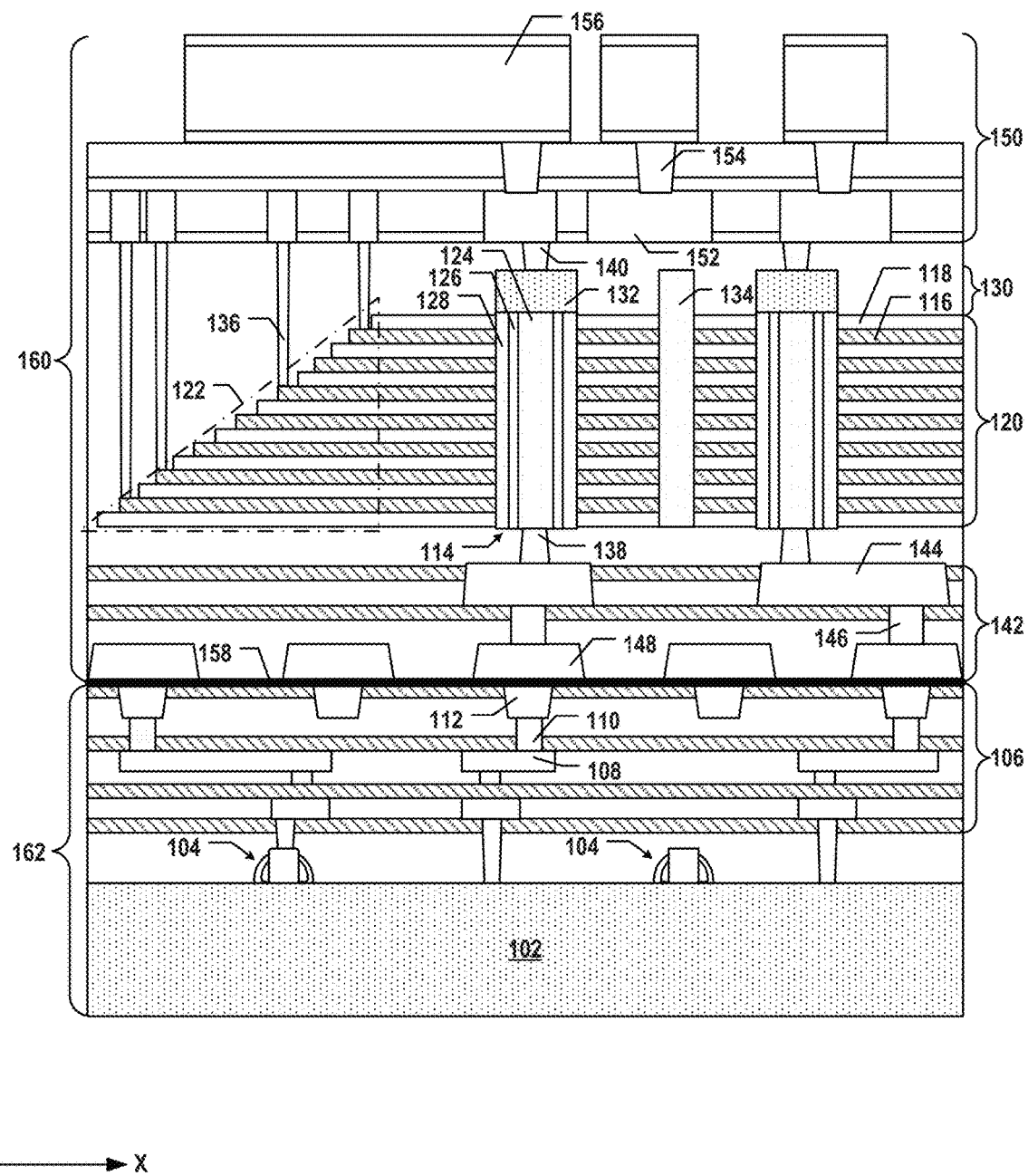
FIG. 1 illustrates a cross-section of an exemplary 3D memory device, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

Various embodiments in accordance with the present disclosure provide a 3D memory device with a smaller die size, higher cell density, and improved performance compared with other 3D memory devices. By vertically stacking a memory array device chip above a peripheral device chip, the cell density of the resulting 3D memory device can be increased. Moreover, by decoupling the peripheral device processing and the memory array device processing, the thermal budget associated with processing the memory array device is not limited by performance requirement of the peripheral device. Similarly, the peripheral device performance is not impacted by the memory array device processing. For example, the peripheral device and the memory array device can be separately fabricated on different substrates so that certain high-temperature processes for fabricating the memory array device will not adversely affect the fabrication of the peripheral device (e.g., avoid excess diffusion of the dopants, control the doping concentration and/or thickness of ion implantation, etc.).

FIG. 1 illustrates a cross-section of an exemplary 3D memory device 100 according to some embodiments of the present disclosure. 3D memory device 100 represents an example of a non-monolithic 3D memory device. The term "non-monolithic" means that the components of 3D memory device 100 (e.g., peripheral devices and memory array devices) can be formed separately on different substrates and then joined to form a 3D memory device. 3D memory device 100 can include a substrate 102, which can include silicon (e.g., single crystalline silicon), silicon germanium (SiGe), gallium arsenide (GaAs), germanium (Ge), silicon on insulator (SOI), or any other suitable materials.

3D memory device 100 can include a peripheral device on substrate 102. The peripheral device can be formed "on" substrate 102, where the entirety or part of the peripheral device is formed in substrate 102 (e.g., below the top surface of substrate 102) and/or directly on substrate 102. The peripheral device can include a plurality of transistors 104 formed on substrate 102. Isolation regions (e.g., shallow trench isolations (STIs), not shown) and doped regions (e.g., source regions and drain regions of transistors 104, not shown) can be formed in substrate 102 as well.

In some embodiments, the peripheral device can include any suitable digital, analog, and/or mixed-signal peripheral circuits used for facilitating the operation of 3D memory device 100. For example, the peripheral device can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). In some embodiments, the peripheral device is formed on substrate 102 using complementary metal-oxide-semiconductor (CMOS) technology (also known as a "CMOS chip").

3D memory device 100 can include an interconnect layer 106 (referred to herein as a "peripheral interconnect layer") above transistors 104 to transfer electrical signals to and from transistors 104. Peripheral interconnect layer 106 can include a plurality of interconnects (also referred to herein as "contacts"), including lateral interconnect lines 108 and vertical interconnect access (via) contacts 110. As used herein, the term "interconnects" can broadly include any suitable types of interconnects, such as middle-end-of-line (MEOL) interconnects and back-end-of-line (BEOL) interconnects.

Peripheral interconnect layer 106 can further include one or more interlayer dielectric (ILD) layers (also known as "intermetal dielectric (IMD) layers") in which interconnect lines 108 and via contacts 110 can form. That is, peripheral interconnect layer 106 can include interconnect lines 108 and via contacts 110 in multiple ILD layers. Interconnect lines 108 and via contacts 110 in peripheral interconnect layer 106 can include conductive materials including, but not limited to, tungsten (W), cobalt (Co), copper (Cu), aluminum (Al), silicides, or any combination thereof. The ILD layers in peripheral interconnect layer 106 can include dielectric materials including, but not limited to, silicon oxide, silicon nitride, silicon oxynitride, low dielectric constant (low-k) dielectrics, or any combination thereof.

In some embodiments, peripheral interconnect layer 106 further includes a plurality of bonding contacts 112 at the top surface of peripheral interconnect layer 106. Bonding contacts 112 can include conductive materials including, but not limited to, W, Co, Cu, Al, silicides, or any combination thereof. The remaining areas at the top surface of peripheral interconnect layer 106 can be formed with dielectric materials including, but not limited to, silicon oxide, silicon nitride, silicon oxynitride, low-k dielectrics, or any combination thereof. Conductive materials (of bonding contacts 112) and dielectric materials at the top surface of peripheral interconnect layer 106 can be used for hybrid bonding as described below in detail.

3D memory device 100 can include a memory array device above the peripheral device. It is noted that x and y axes are included in FIG. 1 to further illustrate the spatial relationship of the components in 3D memory device 100. Substrate 102 includes two lateral surfaces (e.g., a top surface and a bottom surface) extending laterally in the x-direction (i.e., the lateral or width direction). As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 102) in the y-direction (i.e., the vertical or thickness direction) when the substrate is positioned in the lowest plane of the semiconductor device in the y-direction. The same notion for describing spatial relationship is applied throughout the present disclosure.

In some embodiments, 3D memory device 100 is a NAND Flash memory device in which memory cells are provided in the form of an array of NAND memory strings 114 each extending vertically above the peripheral device (e.g., transistors 104) and substrate 102. The memory array device can include NAND memory strings 114 that extend vertically through a plurality of pairs each including a conductor layer 116 and a dielectric layer 118 (referred to herein as "conductor/dielectric layer pairs"). The stacked conductor/dielectric layer pairs are also referred to herein as a "memory stack" 120. Conductor layers 116 and dielectric layers 118 in memory stack 120 alternate in the vertical direction. In other words, except the ones at the top or bottom of memory stack 120, each conductor layer 116 can be adjoined by two dielectric layers 118 on both sides, and each dielectric layer 118 can be adjoined by two conductor layers 116 on both sides. Conductor layers 116 can each have the same thickness or different thicknesses. Similarly, dielectric layers 118 can each have the same thickness or different thicknesses. Conductor layers 116 can include conductor materials including, but not limited to, W, Co, Cu, Al, doped silicon, silicides, or any combination thereof. Dielectric layers 118 can include dielectric materials including, but not limited to, silicon oxide, silicon nitride, silicon oxynitride, or any combination thereof.

Memory stack 120 can include an inner region (also known as a "core array region") and an outer region (also known as a "staircase region"). In some embodiments, the inner region is the center region of memory stack 120 where array of NAND memory strings 114 are formed, and the outer region is the remaining region of memory stack 120 surrounding the inner region (including the sides and edges). As shown in FIG. 1, at least on one lateral side, the outer region of memory stack 120 can include a staircase structure 122. The edges of the conductor/dielectric layer pairs in staircase structure 122 of memory stack 120 along the vertical direction away from substrate 102 (the positive y-direction) are staggered laterally toward array of NAND memory strings 114. In other words, the edges of memory stack 120 in staircase structure 122 can be tilted toward the inner region as moving away from substrate 102 (from bottom to top). The slope of staircase structure 122 can face away from substrate 102. In some embodiments, the length of each conductor/dielectric layer pair of memory stack 120 increases from the top to the bottom.

In some embodiments, each two adjacent conductor/dielectric layer pairs in staircase structure 122 are offset by a nominally same distance in the vertical direction and a nominally same distance in the lateral direction. Each offset thus can form a "landing area" for word line fan-out in the vertical direction. Some of conductor layers 116 in the conductor/dielectric layer pairs can function as the word lines of 3D memory device 100 and extend laterally into staircase structure 122 for interconnection. As shown in FIG. 1, the offset of the edges of each adjacent conductor/dielectric layer pairs in staircase structure 122 is nominally the same, according to some embodiments.

As shown in FIG. 1, each NAND memory string 114 can extend vertically through the inner region of memory stack 120 and include a semiconductor channel 124 and a dielectric layer (also known as a "memory film"). In some embodiments, semiconductor channel 124 includes silicon, such as amorphous silicon, polysilicon, or single crystalline silicon. In some embodiments, the memory film is a composite layer including a tunneling layer 126, a storage layer 128 (also known as a "charge trap/storage layer"), and a blocking layer (not shown). Each NAND memory string 114 can have a cylinder shape (e.g., a pillar shape). Semiconductor channel 124, tunneling layer 126, storage layer 128, and the blocking layer are arranged radially from the center toward the outer surface of the pillar in this order, according to some embodiments. Tunneling layer 126 can include silicon oxide, silicon oxynitride, or any combination thereof. Storage layer 128 can include silicon nitride, silicon oxynitride, silicon, or any combination thereof. The blocking layer can include silicon oxide, silicon oxynitride, high dielectric constant (high-k) dielectrics, or any combination thereof.

In some embodiments, NAND memory strings 114 further include a plurality of control gates (each being part of a word line). Each conductor layer 116 in memory stack 120 can act as a control gate for each memory cell of NAND memory string 114. Each NAND memory string 114 can include a source select gate at its upper end and a drain select gate at its lower end. As used herein, the "upper end" of a component (e.g., NAND memory string 114) is the end farther away from substrate 102 in the y-direction, and the "lower end" of the component (e.g., NAND memory string 114) is the end closer to substrate 102 in the y-direction. For each NAND memory string 114, the drain select gate can be disposed below the source select gate in 3D memory device 100.

In some embodiments, 3D memory device 100 further includes a semiconductor layer 130 disposed above and in contact with NAND memory strings 114, for example, on the upper end of each NAND memory string 114. Memory stack 120 can be disposed below semiconductor layer 130. Semiconductor layer 130 can be a thinned substrate on which memory stack 120 is formed. In some embodiments, semiconductor layer 130 includes a plurality of semiconductor plugs 132 electrically separated by isolation regions (e.g., STIs). In some embodiments, each semiconductor plug 132 is disposed at the upper end of corresponding NAND memory string 114 and functions as the source of corresponding NAND memory string 114 and thus, can be considered as part of corresponding NAND memory string 114. Semiconductor plug 132 can include a single crystalline silicon. Semiconductor plug 132 can be un-doped, partially doped (in the thickness direction and/or the width direction), or fully doped by p-type or n-type dopants. In some embodiments, semiconductor plug 132 can include SiGe, GaAs, Ge, or any other suitable materials. In some embodiments, the thickness of semiconductor layer 130 (and semiconductor plug 132 therein) is between about 0.1 μm and about 50 μm, such as between 0.1 μm and 50 μm. In some embodiments, the thickness of semiconductor layer 130 (and semiconductor plug 132 therein) is between about 0.2 μm and about 5 μm, such as between 0.2 μm and 5 μm (e.g., 0.2 μm, 0.3 μm, 0.4 μm, 0.5 μm, 0.6 μm, 0.7 μm, 0.8 μm, 0.9 μm, 1 μm, 2 μm, 3 μm, 4 μm, 5 μm, any range bounded by the lower end by any of these values, or in any range defined by any two of these values).

In some embodiments, 3D memory device 100 further includes a gate line slit ("GLS") 134 that extends vertically through memory stack 120. GLS 134 can be used to form the conductor/dielectric layer pairs in memory stack 120 by a gate replacement process. In some embodiments, GLS 134 is firstly filled with dielectric materials, for example, silicon oxide, silicon nitride, or any combination thereof, for separating the NAND memory string array into different regions (e.g., memory fingers and/or memory blocks). Then, GLS 134 is filled with conductive and/or semiconductor materials, for example, W, Co, polysilicon, or any combination thereof, for electrically controlling an array common source (ACS), according to some embodiments.

In some embodiments, 3D memory device 100 includes local interconnects that are formed in one or more ILD layers and in contact with components in memory stack 120, such as the word lines (e.g., conductor layers 116) and NAND memory strings 114. The interconnects are referred to herein as "local interconnects" as they are in contact with the components in memory stack 120 directly for fan-out. As used herein, the term "interconnects" can broadly include any suitable types of interconnects, including vertical interconnect access (e.g., via) contacts and lateral interconnect lines. The local interconnects can include word line via contacts 136, bit line via contacts 138, and source line via contacts 140. Each local interconnect can include an opening (e.g., a via hole or a trench) filled with conductive materials including, but not limited to, W, Co, Cu, Al, silicides, or any combination thereof.

Word line via contacts 136 can extend vertically through one or more ILD layers. Each word line via contact 136 can have its lower end in contact with corresponding conductor layer 116 (e.g., at the landing area) in staircase structure 122 of memory stack 120 to individually address a corresponding word line of 3D memory device 100. In some embodiments, each word line via contact 136 is disposed above corresponding conductor layer 116. Each bit line via contact 138 can be disposed below memory stack 120 and have its upper end in contact with the lower end (the drain end) of corresponding NAND memory string 114 to individually address corresponding NAND memory string 114. Multiple bit line via contacts 138 are disposed below and in contact with multiple NAND memory strings 114, respectively, according to some embodiments. As shown in FIG. 1, word line via contacts 136 and bit line via contacts 138 fan-out the corresponding memory stack components toward opposite vertical directions (the positive and negative y-directions). Source line via contacts 140 can extend vertically through one or more ILD layers. Each source line via contact 140 can have its lower end in contact with corresponding semiconductor plug 132 (e.g., the source) of NAND memory string 114. In some embodiments, each source line via contact 140 is disposed above corresponding NAND memory string 114.

Similar to the peripheral device, the memory array device of 3D memory device 100 can also include interconnect layers for transferring electrical signals to and from NAND memory strings 114. As shown in FIG. 1, 3D memory device 100 can include an interconnect layer 142 (referred to herein as an "array interconnect layer") below NAND memory strings 114. Array interconnect layer 142 can include a plurality of interconnects, including interconnect lines 144 and via contacts 146 in one or more ILD layers. In some embodiments, array interconnect layer 142 includes a plurality of bonding contacts 148 at its bottom surface. Interconnect lines 144, via contacts 146, and bonding contacts 148 can include conductive materials including, but not limited to, W, Co, Cu, Al, silicides, or any combination thereof. The remaining areas at the bottom surface of array interconnect layer 142 can be formed with dielectric materials including, but not limited to, silicon oxide, silicon nitride, silicon oxynitride, low-k dielectrics, or any combination thereof. Conductive materials (of bonding contacts 148) and dielectric materials at the bottom surface of array interconnect layer 142 can be used for hybrid bonding as described below in detail.

As shown in FIG. 1, another interconnect layer 150 (referred to herein as a "BEOL interconnect layer") can be disposed above NAND memory strings 114 and semiconductor layer 130 and can include interconnects, such as interconnect lines 152 and via contacts 154 in one or more ILD layers. BEOL interconnect layer 150 can further include contact pads 156 and a redistribution layer (not shown) at the top surface of 3D memory device 100 for wire bonding and/or bonding with an interposer. BEOL interconnect layer 150 and array interconnect layer 142 can be formed at opposite sides of NAND memory strings 114. In some embodiments, interconnect lines 152, via contacts 154, and contact pads 156 in BEOL interconnect layer 150 can transfer electrical signals between 3D memory device 100 and external circuits. BEOL interconnect layer 150 can be electrically connected to the memory stack components by the local interconnects. As shown in FIG. 1, each word line via contact 136 can have its upper end in contact with BEOL interconnect layer 150. Similarly, each source line via contact 140 can have its upper end in contact with BEOL interconnect layer 150. The arrangement and configuration of staircase structure 122 and semiconductor layer 130 allow direct fan-out of the word lines (e.g., conductor layers 116) and the sources of NAND memory strings 114 through the local interconnects (e.g., word line via contacts 136 and source line via contacts 140) and BEOL interconnect layer 150 without detouring through array interconnect layer 142.

In some embodiments, 3D memory device 100 further includes one or more through array contacts (TACs, not shown) that extend vertically through memory stack 120. Each TAC can extend through the entirety of memory stack 120, (e.g., all the conductor/dielectric layer pairs therein) and have its upper end in contact with BEOL interconnect layer 150 and its lower end in contact with array interconnect layer 142. TACs can thus make electrical connections between peripheral interconnect layer 106 and BEOL interconnect layer 150 and carry electrical signals from the peripheral device to the BEOL interconnects of 3D memory device 100.

A bonding interface 158 can be formed between peripheral interconnect layer 106 and array interconnect layer 142. Bonding contacts 112 and be bonded with bonding contacts 148 at bonding interface 158. As shown in FIG. 1, the peripheral device (e.g., transistors 104) can be disposed below the memory array device (e.g., NAND memory strings 114) in 3D memory device 100 after bonding. In 3D memory device 100, bonding interface 158 is disposed between the memory array device (e.g., memory strings 114) and the peripheral device (e.g., transistors 104), according to some embodiments. Peripheral interconnect layer 106 can be between bonding interface 158 and the peripheral device (e.g., transistors 104), and array interconnect layer 142 can be between bonding interface 158 and the memory array device (e.g., memory strings 114).

In some embodiments, a first semiconductor structure (e.g., a memory array device chip 160), including NAND memory strings 114, semiconductor layer 130 (e.g., a thinned substrate), array interconnect layer 142, BEOL interconnect layer 150, and word line via contacts 136, is bonded to a second semiconductor structure (e.g., a peripheral device chip 162), including substrate 102, the peripheral device (e.g., transistors 104), and peripheral interconnect layer 106, in a face-to-face manner at bonding interface 158. Array interconnect layer 142 can contact peripheral interconnect layer 106 at bonding interface 158. Peripheral device chip 162 and memory array device chip 160 can be bonded using hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. The metal-metal bonding can be formed between bonding contacts 148 and bonding contacts 112, and the dielectric-dielectric bonding can be formed between the dielectric materials at the remaining areas at bonding interface 158.

Figure 2A:
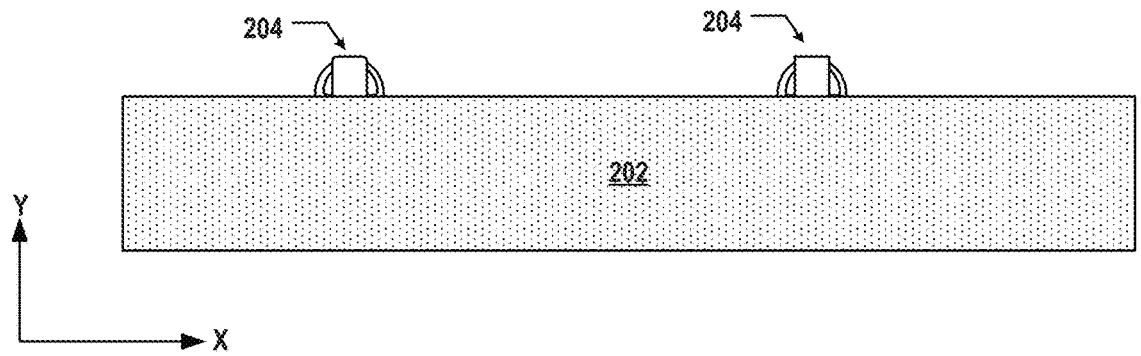
FIGS. 2A-2B illustrate a fabrication process for forming an exemplary peripheral device chip, according to some embodiments.
Figure 2B:
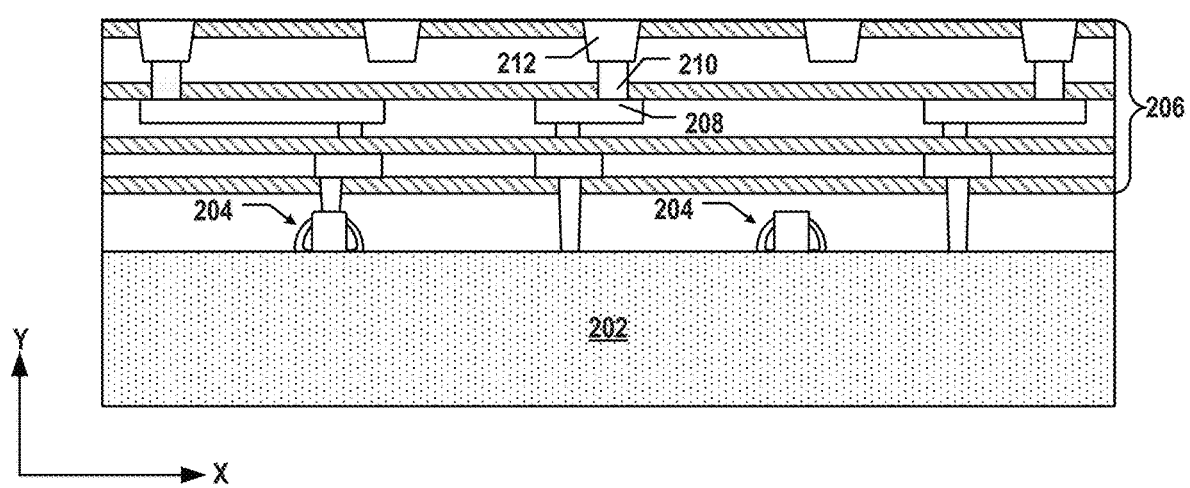
Figure 5:
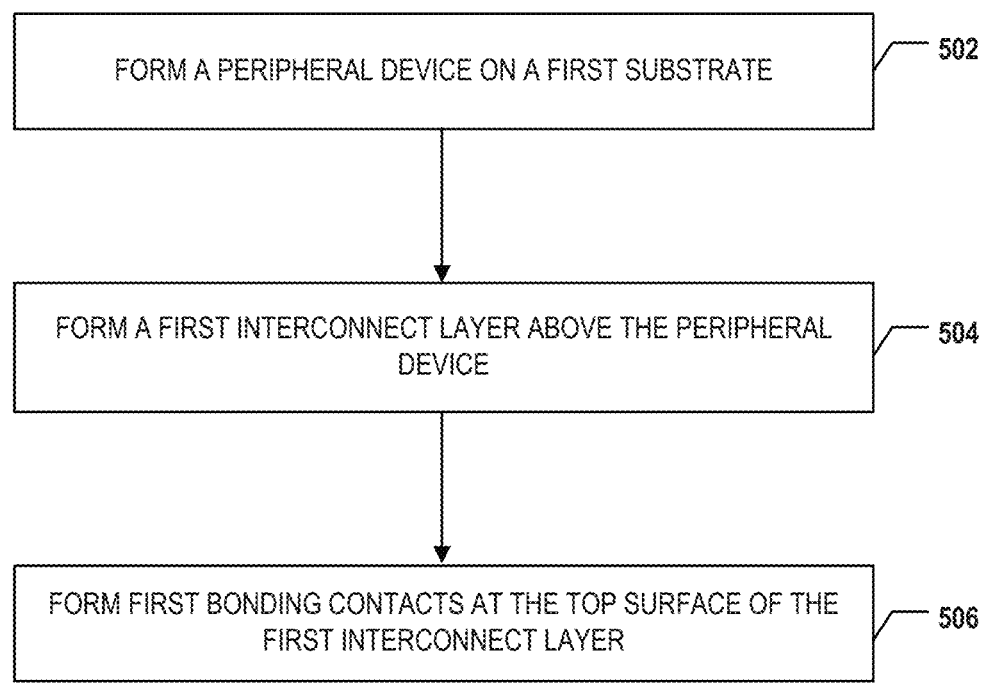
FIG. 5 is a flowchart of a method for forming an exemplary peripheral device chip, according to some embodiments.
Figure 6:
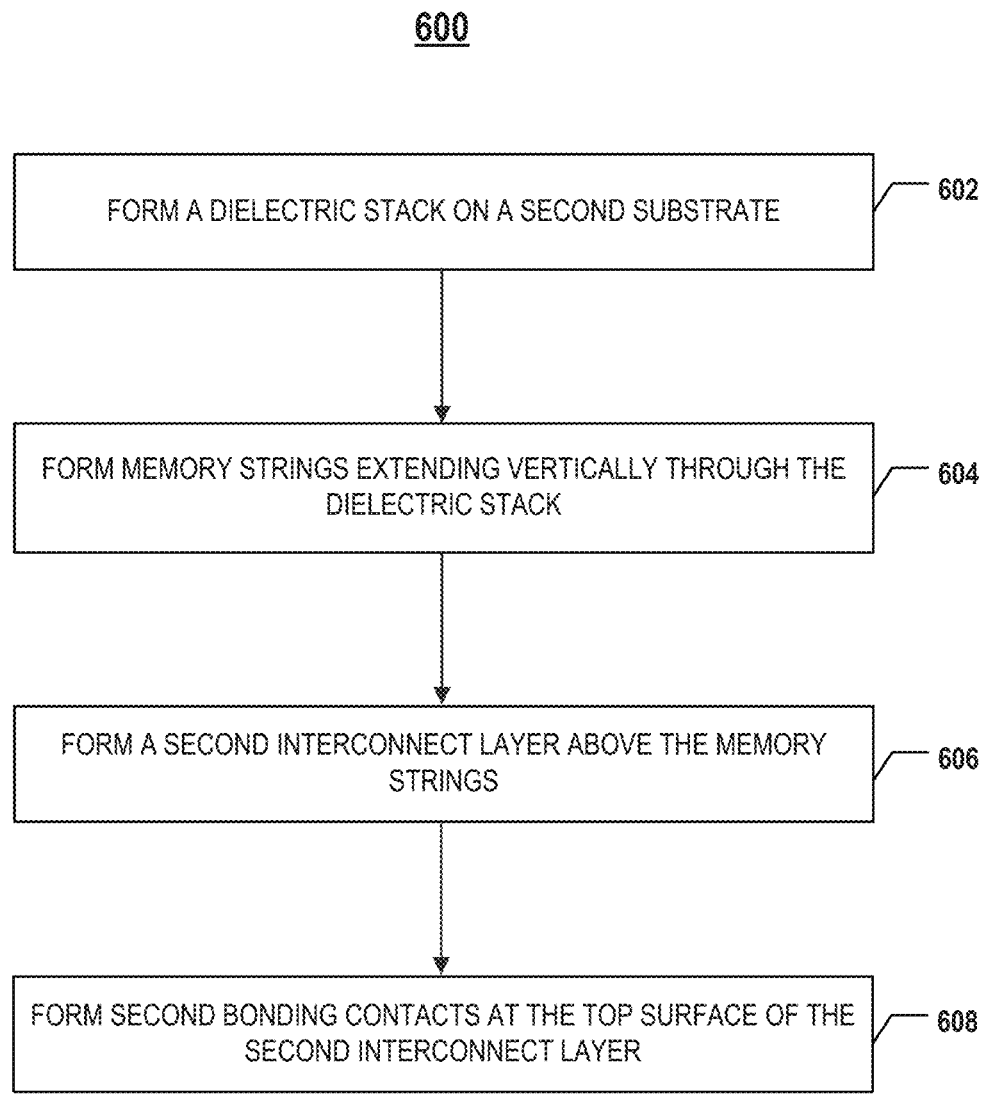
FIG. 6 is a flowchart of a method for forming an exemplary memory array device chip, according to some embodiments.
Figure 7:
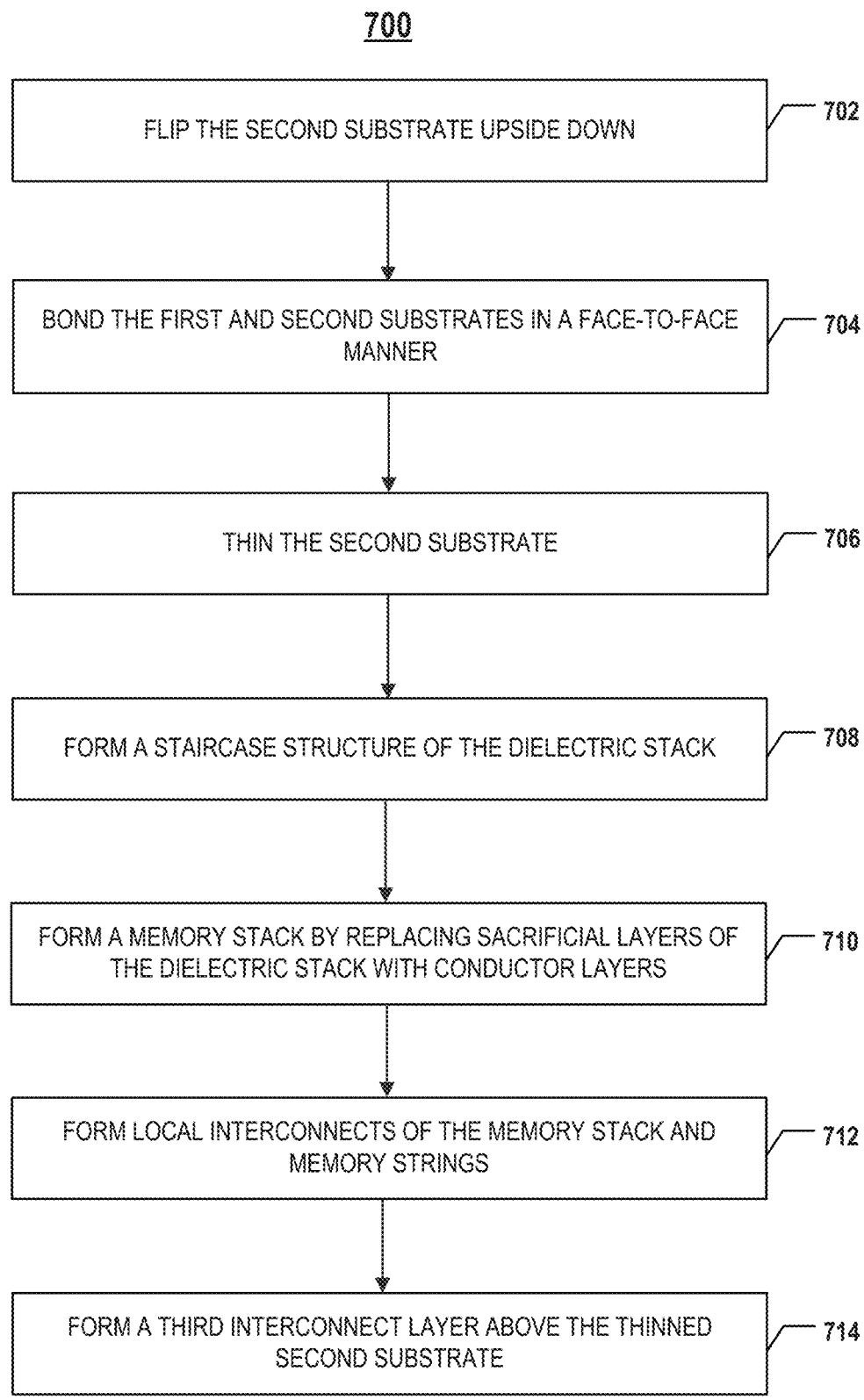
FIG. 7 is a flowchart of a method for forming an exemplary 3D memory device with a memory array device chip bonded to a peripheral device chip, according to some embodiments.

FIGS. 2A-2B illustrate a fabrication process for forming an exemplary peripheral device chip, according to some embodiments. FIGS. 3A-3D illustrate a fabrication process for forming an exemplary memory array device chip, according to some embodiments. FIGS. 4A-4F illustrate a fabrication process for forming an exemplary 3D memory device with a memory array device chip bonded to a peripheral device chip, according to some embodiments. FIG. 5 is a flowchart of a method 500 for forming an exemplary peripheral device chip, according to some embodiments. FIG. 6 is a flowchart of a method 600 for forming an exemplary memory array device chip, according to some embodiments. FIG. 7 is a flowchart of a method 700 for forming an exemplary 3D memory device with a memory array device chip bonded to a peripheral device chip, according to some embodiments. Examples of the 3D memory device depicted in FIGS. 2-7 include 3D memory device 100 depicted in FIG. 1. FIGS. 2-7 will be described together. It is understood that the operations shown in methods 500, 600, and 700 are not exhaustive and that other operations can be performed as well before, after, or between any of the illustrated operations. Further, some of the operations may be performed simultaneously, or in a different order than shown in FIGS. 5-7.

Referring to FIG. 5, method 500 starts at operation 502, in which a peripheral device is formed on a first substrate. The substrate can be a silicon substrate. As illustrated in FIG. 2A, a peripheral device is formed on a silicon substrate 202. The peripheral device can include a plurality of transistors 204 formed on silicon substrate 202. Transistors 204 can be formed by a plurality of processes including, but not limited to, photolithography, dry/wet etch, thin film deposition, thermal growth, implantation, chemical mechanical polishing (CMP), and any other suitable processes. In some embodiments, doped regions (not shown) are formed in silicon substrate 202 by ion implantation and/or thermal diffusion, which function, for example, as source regions and/or drain regions of transistors 204. In some embodiments, isolation regions (e.g., STIs, not shown) are also formed in silicon substrate 202 by wet/dry etch and thin film deposition.

Method 500 proceeds to operation 504, as illustrated in FIG. 5, in which a first interconnect layer (e.g., a peripheral interconnect layer) is formed above the peripheral device. The peripheral interconnect layer can include a first plurality of interconnects in one or more ILD layers. Method 500 proceeds to operation 506, as illustrated in FIG. 5, in which a first plurality of bonding contacts are formed at the top surface of the peripheral interconnect layer.

As illustrated in FIG. 2B, a peripheral interconnect layer 206 can be formed above transistors 204. Peripheral interconnect layer 206 can include interconnects, including interconnect lines 208 and via contacts 210 of MEOL and/or BEOL of the peripheral device chip in a plurality of ILD layers, to make electrical connections with the peripheral device (e.g., transistors 204). Bonding contacts 212 can be formed at the top surface of peripheral interconnect layer 206 for hybrid bonding. In some embodiments, peripheral interconnect layer 206 includes multiple ILD layers and interconnects therein formed by multiple processes. For example, interconnect lines 208, via contacts 210, and bonding contacts 212 can include conductive materials deposited by one or more thin film deposition processes including, but not limited to, chemical vapor deposition (CVD), physical vapor deposition (PVD), atomic layer deposition (ALD), electroplating, electroless plating, or any combination thereof. Fabrication processes to form interconnect lines 208, via contacts 210, and bonding contacts 212 can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 2B can be collectively referred to as an "interconnect layer" (e.g., peripheral interconnect layer 206).

Figure 3A:
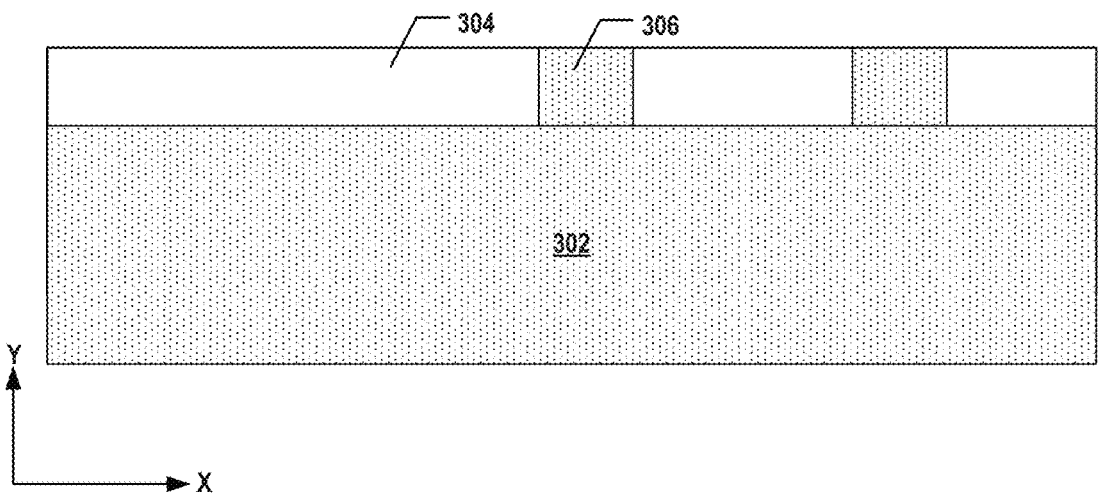
FIGS. 3A-3D illustrate a fabrication process for forming an exemplary memory array device chip, according to some embodiments.

Referring to FIG. 6, method 600 includes operation 602, in which a dielectric stack is formed on a second substrate. The substrate can be a silicon substrate. The dielectric stack can include a plurality of dielectric/sacrificial layer pairs. As illustrated in FIG. 3A, isolation regions 304 (e.g., STIs) are formed in a silicon substrate 302 by wet/dry etch and thin film deposition to electrically isolate silicon plugs 306 (e.g., single crystalline silicon plugs). Silicon plugs 306 can be patterned and doped with n-type or p-type dopant using ion implantation and/or thermal diffusion processes. In some embodiments, the thickness of isolation regions 304 and silicon plugs 306 is between about 0.1 μm and about 50 μm, such as between 0.1 μm and 50 μm. In some embodiments, the thickness of isolation regions 304 and silicon plugs 306 is between about 0.2 μm and about 5 μm, such as between 0.2 μm and 5 μm (e.g., 0.2 μm, 0.3 μm, 0.4 μm, 0.5 μm, 0.6 μm, 0.7 μm, 0.8 μm, 0.9 μm, 1 μm, 2 μm, 3 μm, 4 μm, 5 μm, any range bounded by the lower end by any of these values, or in any range defined by any two of these values).

Figure 3B:
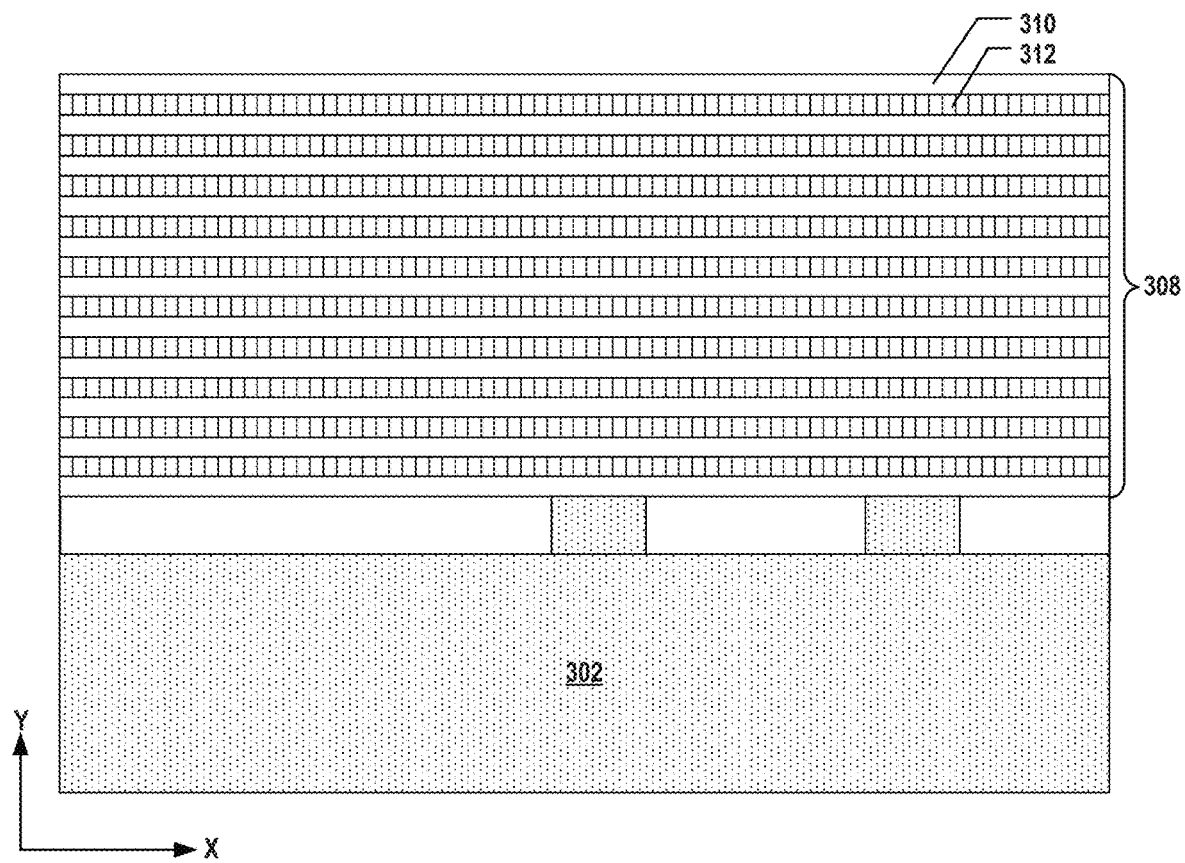

As illustrated in FIG. 3B, pairs of a first dielectric layer 310 and a second dielectric layer (known as a "sacrificial layer") 312 (together referred to herein as "dielectric layer pairs") are formed on silicon substrate 302. The stacked dielectric layer pairs can form a dielectric stack 308. Dielectric stack 308 can include an alternating stack of sacrificial layer 312 and dielectric layer 310 that is different from sacrificial layer 312. In some embodiments, each dielectric layer pair includes a layer of silicon nitride and a layer of silicon oxide. In some embodiments, sacrificial layers 312 can each have the same thickness or have different thicknesses. Similarly, dielectric layers 310 can each have the same thickness or have different thicknesses. Dielectric stack 308 can be formed by one or more thin film deposition processes including, but not limited to, CVD, PVD, ALD, or any combination thereof.

Figure 3C:
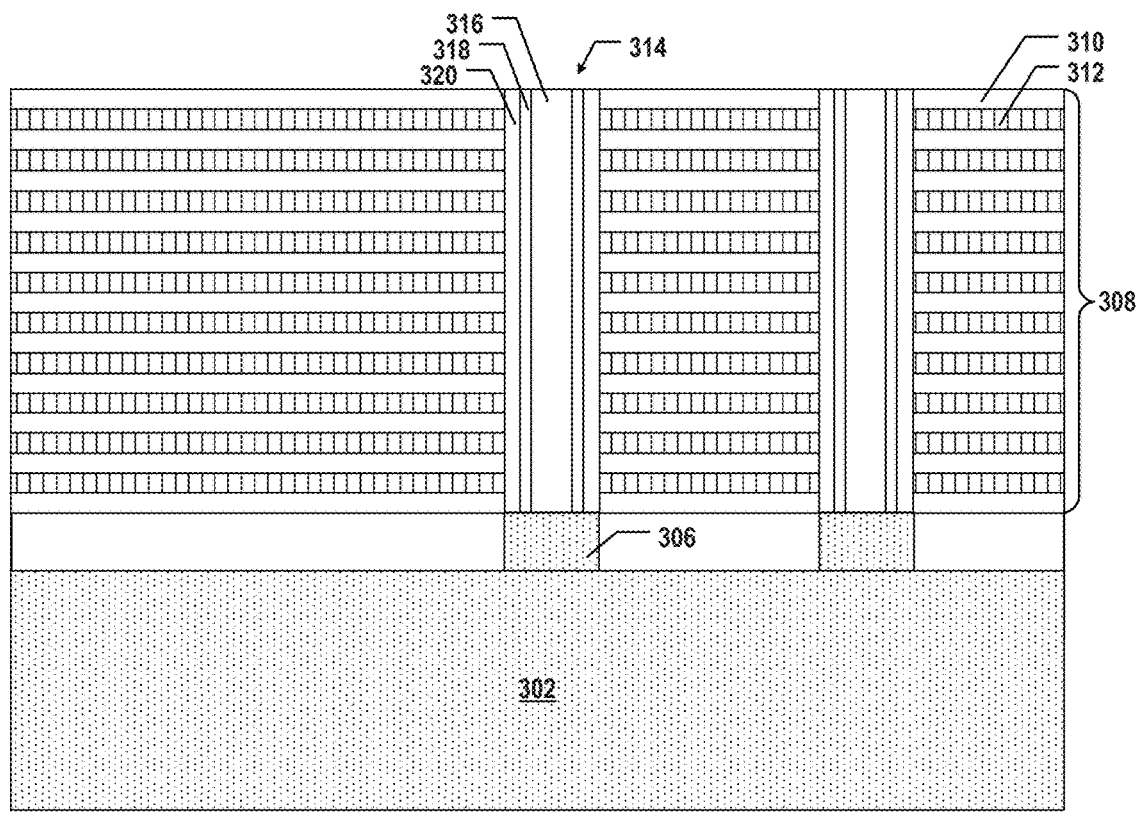

Method 600 proceeds to operation 604, as illustrated in FIG. 6, in which a plurality of memory strings each extending vertically through the dielectric stack are formed. As illustrated in FIG. 3C, NAND memory strings 314 are formed on silicon substrate 302, each of which extends vertically through dielectric stack 308. In some embodiments, each NAND memory string 314 can be aligned with corresponding silicon plug 306. Silicon plug 306 can be part of NAND memory string 314. In some embodiments, fabrication processes to form NAND memory string 314 include forming a semiconductor channel 316 that extends vertically through dielectric stack 308. In some embodiments, fabrication processes to form NAND memory string 314 also include forming a composite dielectric layer (memory film) between semiconductor channel 316 and the plurality of dielectric/sacrificial layer pairs in dielectric stack 308. The memory film can be a combination of multiple dielectric layers including, but not limited to, a tunneling layer 318, a storage layer 320, and a blocking layer.

Tunneling layer 318 can include dielectric materials including, but not limited to, silicon oxide, silicon nitride, silicon oxynitride, or any combination thereof. Storage layer 320 can include materials for storing charge for memory operation. The storage layer materials can include, but not limited to, silicon nitride, silicon oxynitride, a combination of silicon oxide and silicon nitride, or any combination thereof. The blocking layer can include dielectric materials including, but not limited to, silicon oxide or a combination of silicon oxide/silicon oxynitride/silicon oxide (ONO). The blocking layer can further include a high-k dielectric layer, such as an aluminum oxide layer. Semiconductor channel 316 and the memory film (including tunneling layer 318 and storage layer 320) can be formed by processes such as ALD, CVD, PVD, any other suitable processes, or any combination thereof.

Figure 3D:
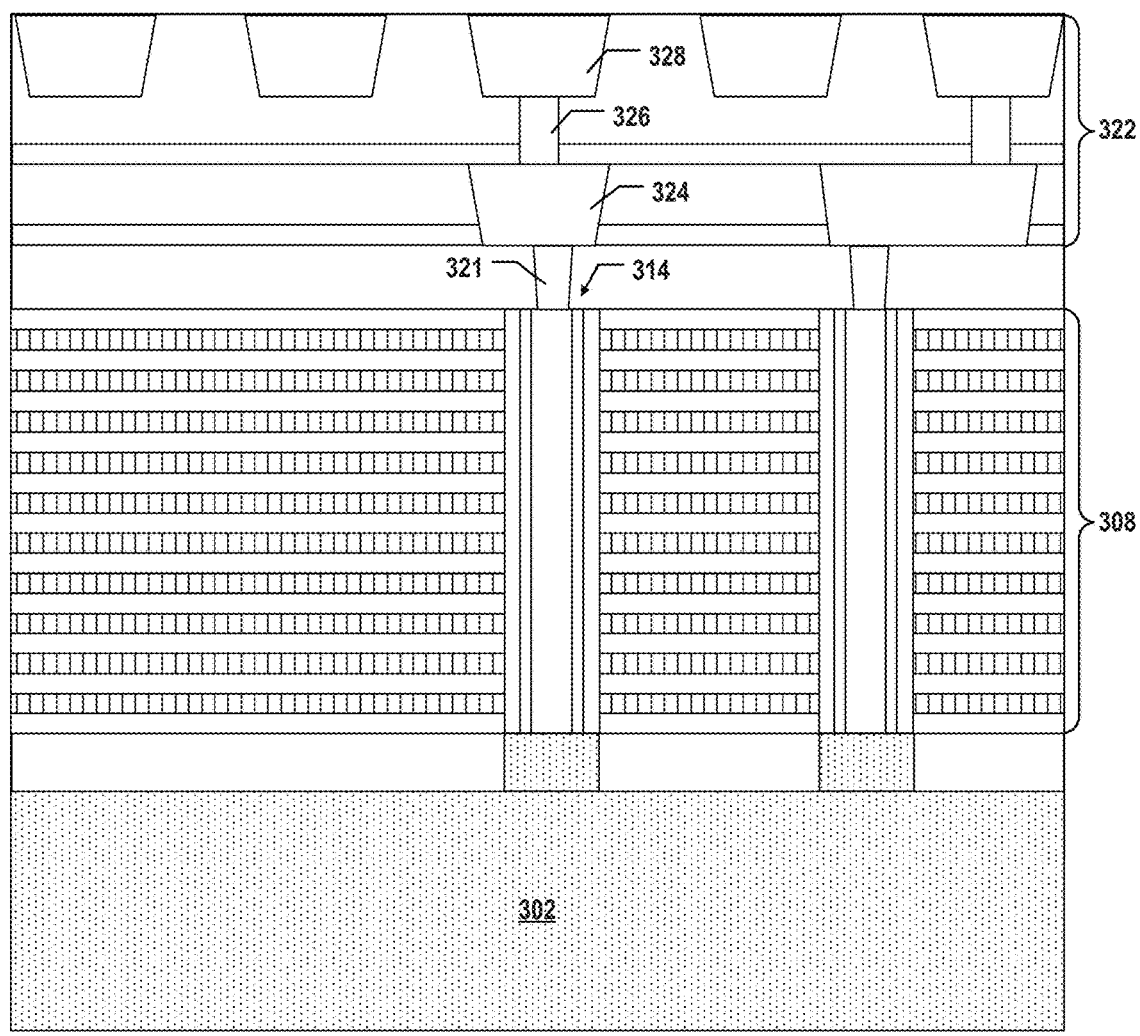

Method 600 proceeds to operation 606, as illustrated in FIG. 6, in which a second interconnect layer (e.g., an array interconnect layer) is formed above the memory strings. The array interconnect layer can include a second plurality of interconnects in one or more ILD layers. Method 600 proceeds to operation 608, as illustrated in FIG. 6, in which a second plurality of bonding contacts are formed at the top surface of the array interconnect layer. As illustrated in FIG. 3D, an array interconnect layer 322 can be formed above dielectric stack 308 and NAND memory strings 314. Array interconnect layer 322 can include interconnects, including interconnect lines 324 and via contacts 326 in one or more ILD layers for transferring electrical signals to and from NAND memory strings 314. In some embodiments, bit line via contacts 321 can be formed in an ILD layer formed above dielectric stack 308 prior to forming array interconnect layer 322, such that each bit line via contact 321 is above and in contact with corresponding NAND memory string 314. Bonding contacts 328 can be formed at the top surface of array interconnect layer 322 for hybrid bonding.

In some embodiments, array interconnect layer 322 includes multiple ILD layers and interconnects therein formed in multiple processes. For example, interconnect lines 324, via contacts 326, and bonding contacts 328 can include conductive materials deposited by one or more thin film deposition processes including, but not limited to, CVD, PVD, ALD, electroplating, electroless plating, or any combination thereof. Fabrication processes to form interconnect lines 324, via contacts 326, and bonding contacts 328 can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 3D can be collectively referred to as an "interconnect layer" (e.g., array interconnect layer 322).

Referring to FIG. 7, method 700 includes operation 702, in which the second substrate on which the memory strings are formed is flipped upside down. As a result, the second substrate is above the memory strings. Method 700 proceeds to operation 704, as illustrated in FIG. 7, in which the second substrate and the first substrate on which the peripheral device is formed are bonded in a face-to-face manner, so that the peripheral interconnect layer is below and in contact with the array interconnect layer. The bonding can be hybrid bonding.

Figure 4A:
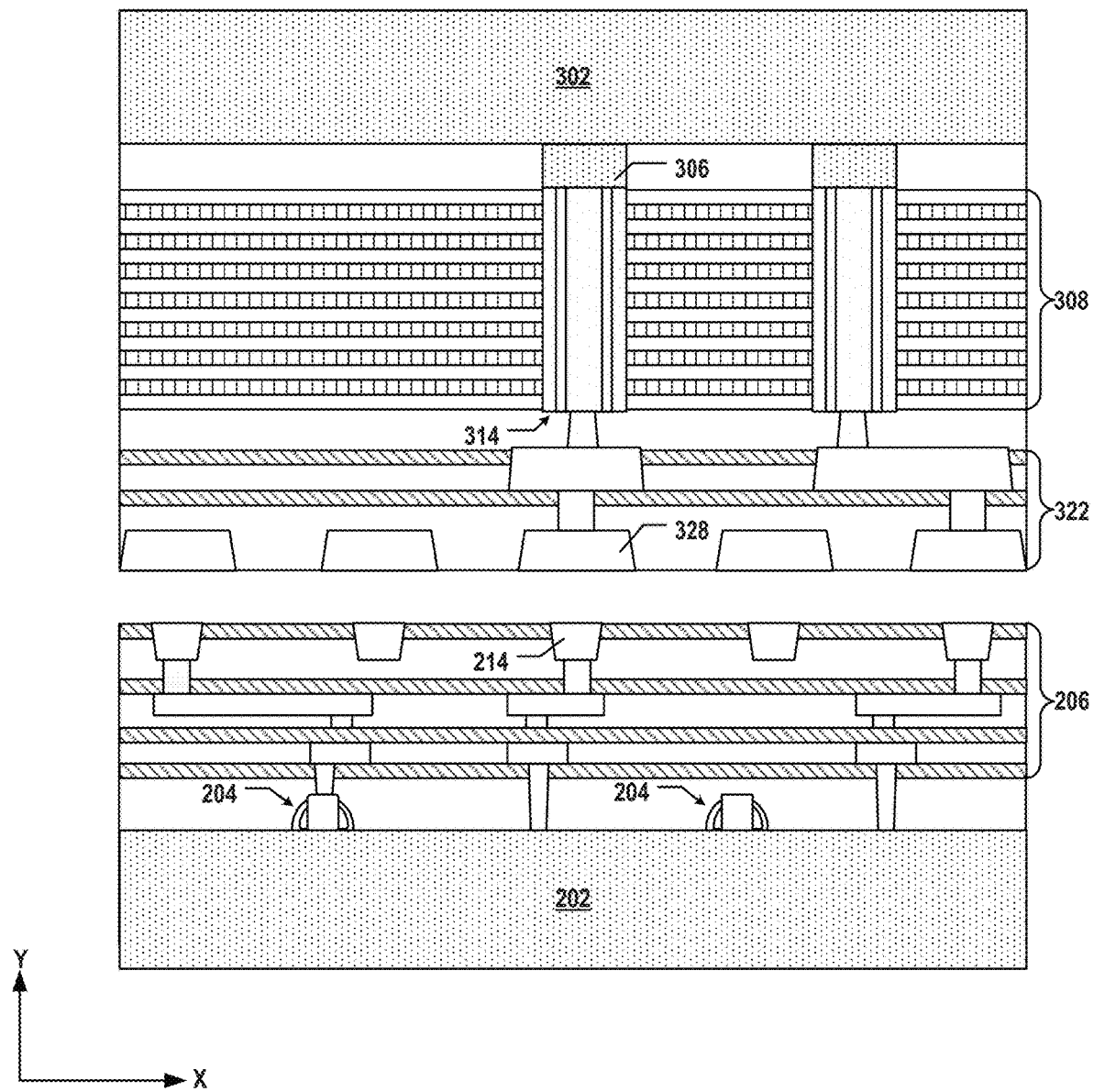
FIGS. 4A-4F illustrate a fabrication process for forming an exemplary 3D memory device with a memory array device chip bonded to a peripheral device chip, according to some embodiments.
Figure 4B:
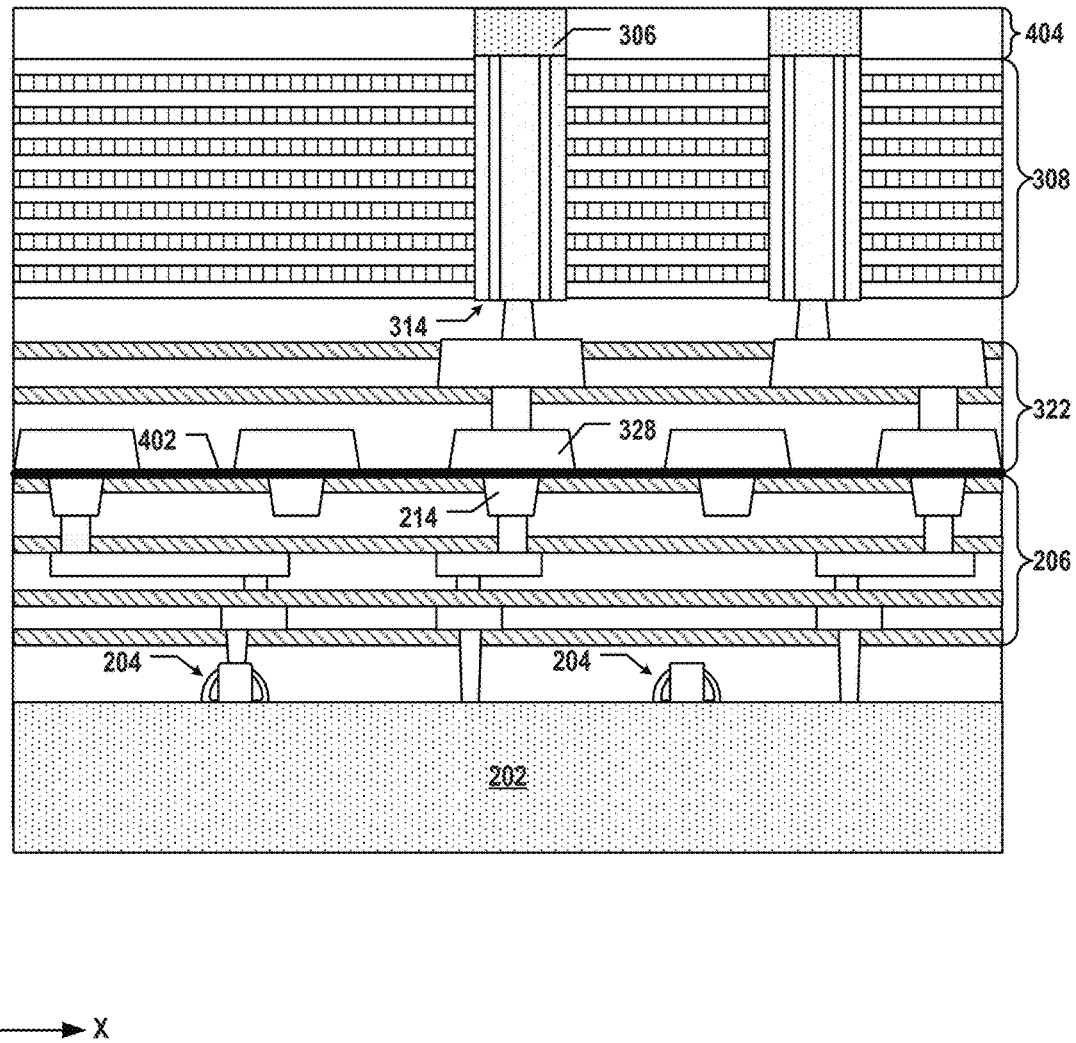

As illustrated in FIG. 4A, silicon substrate 302 and components formed thereon (e.g., NAND memory strings 314) are flipped upside down. Array interconnect layer 322 facing down is to be bonded with peripheral interconnect layer 206 facing up, i.e., in a face-to-face manner, so that array interconnect layer 322 can be above and in contact with peripheral interconnect layer 206 in the resulting 3D memory device. In some embodiments, bonding contacts 328 of array interconnect layer 322 are aligned with bonding contacts 214 of peripheral interconnect layer 206 prior to the bonding. As a result, bonding contacts 328 can be in contact with bonding contacts 214 when silicon substrate 302 is joined with silicon substrate 202. In some embodiments, a treatment process, e.g., a plasma treatment, a wet treatment, and/or a thermal treatment, is applied to the bonding surfaces prior to the bonding. As a result of the bonding, e.g., hybrid bonding, bonding contacts 328 can be inter-mixed with bonding contacts 214, thereby forming a bonding interface 402 between array interconnect layer 322 and peripheral interconnect layer 206, as shown in FIG. 4B.

Method 700 proceeds to operation 706, as illustrated in FIG. 7, in which the second substrate is thinned. As illustrated in FIG. 4B, silicon substrate 302 becomes a single crystalline silicon layer 404 (including silicon plugs 306 and the surrounding isolation regions) after the thinning. In some embodiments, after the thinning process, single crystalline silicon layer 404 (and silicon plugs 306 therein) has a thickness between about 0.1 µm and about 50 µm, such as between 0.1 µm and 50 µm. In some embodiments, the thickness of single crystalline silicon layer 404 (and silicon plugs 306 therein) is between about 0.2 µm and about 5 µm, such as between 0.2 µm and 5 µm (e.g., 0.2 µm, 0.3 µm, 0.4 µm, 0.5 µm, 0.6 µm, 0.7 µm, 0.8 µm, 0.9 µm, 1 µm, 2 µm, 3 µm, 4 µm, 5 µm, any range bounded by the lower end by any of these values, or in any range defined by any two of these values). Silicon substrate 302 can be thinned by processes including, but not limited to, wafer grinding, dry etch, wet etch, CMP, any other suitable processes, or any combination thereof.

Figure 4C:
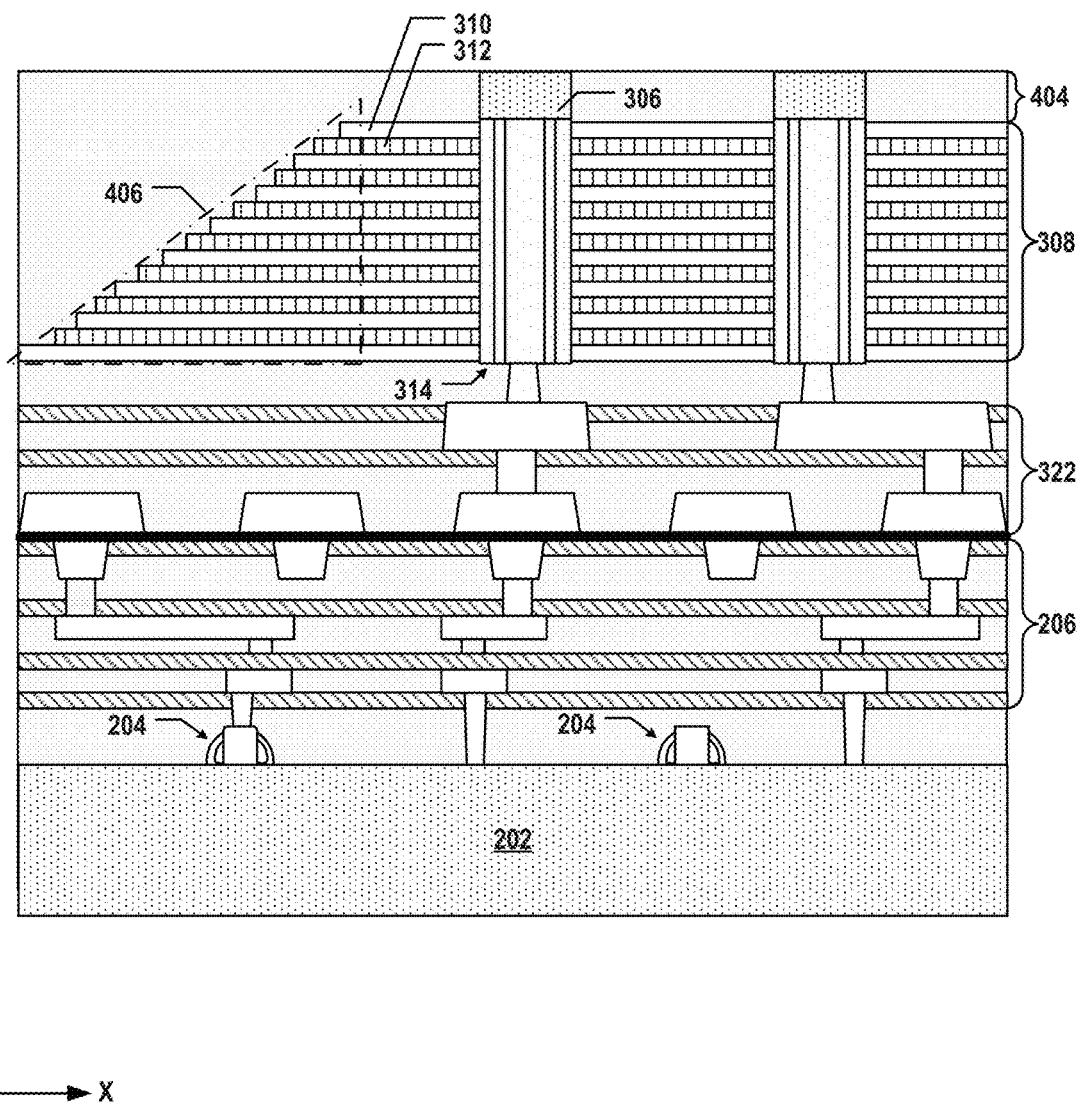

Method 700 proceeds to operation 708, as illustrated in FIG. 7, in which a staircase structure is formed at an edge of the dielectric stack. The staircase structure can be formed by performing a plurality of trim-etch cycles for the dielectric/sacrificial layer pairs toward the first substrate. As illustrated in FIG. 4C, a staircase structure 406 is formed at the edge of dielectric stack 308. Edges of the dielectric/sacrificial layer pairs in staircase structure 406 of dielectric stack 308 along the vertical direction away from silicon substrate 202 (the positive y-direction) are staggered laterally toward NAND memory strings 314. To form staircase structure 406, a photoresist layer can be patterned to expose portions of the top one of the dielectric/sacrificial layer pairs. The patterned photoresist layer can be used as an etch mask to etch the exposed portions of the top one of the dielectric/sacrificial layer pairs by wet etch and/or dry etch. Any suitable etchants (e.g., of wet etch and/or dry etch) can be used to remove the entire thickness of the top one of the dielectric/sacrificial layer pairs in the exposed portions (including sacrificial layer 312 and dielectric layer 310 therein). The etched thickness can be controlled by etch-stop at different materials (e.g., silicon nitride and silicon oxide) used in the dielectric/sacrificial layer pair. The etching of the exposed portions of the top one of the dielectric/sacrificial layer pairs can result in the exposure of portions of the one beneath the top one of the dielectric/sacrificial layer pairs.

The patterned photoresist layer can then be trimmed (e.g., etched incrementally and inwardly, often from all directions) to expose another portion of the top one of the dielectric/sacrificial layer pairs. The amount of the trimmed photoresist layer can be controlled by trim rate and/or trim time and can be directly relevant (e.g., determinant) to the dimensions of the resulting step structure. The trim of the photoresist layer can be performed using any suitable etch process, e.g., an isotropic dry etch or a wet etch. Both the enlarged exposed portions of the top one of the dielectric/sacrificial layer pairs and the exposed portions of the one beneath the top one of the dielectric/sacrificial layer pairs are etched using the trimmed photoresist layer as an etch mask to form one step structure of staircase structure 406. Any suitable etchants (e.g., of wet etch and/or dry etch) can be used to remove the entire thickness of the dielectric/sacrificial layer pair in the exposed portions (including sacrificial layer 312 and dielectric layer 310 therein) toward silicon substrate 202. The trim process of the photoresist layer followed by the etch process of the dielectric/sacrificial layer pair is referred to herein as a trim-etch cycle for the dielectric/sacrificial layer pairs.

The trim-etch cycle for the dielectric/sacrificial layer pairs can be repeated toward silicon substrate 202 (the negative y-direction) until finishing the etching of the bottom one of the dielectric/sacrificial layer pairs. Consequently, staircase structure 406 having a plurality of step structures at the edge of dielectric stack 308 can be formed. Due to the repeated trim-etch cycles for the dielectric/sacrificial layer pairs, dielectric stack 308 can have a tilted side edge and a top dielectric/sacrificial layer pair shorter than the bottom one, as shown in FIG. 4C.

Method 700 proceeds to operation 710, as illustrated in FIG. 7, in which a memory stack is formed below the thinned second substrate by replacing, with a plurality of conductor layers, sacrificial layers in the dielectric/sacrificial layer pairs. The memory stack thus includes a plurality of conductor/dielectric layer pairs. In some embodiments, forming the memory stack includes etching an opening through the thinned second substrate and the dielectric/sacrificial layer pairs, etching the sacrificial layers in the dielectric/sacrificial layer pairs through the opening, and depositing the conductor layers in the conductor/dielectric layer pairs through the opening. As a result, a staircase structure can be formed at an edge of the memory stack. The edges of the conductor/dielectric layer pairs in the staircase structure of the memory stack along the vertical direction away from the first substrate can be staggered laterally toward the memory strings.

Figure 4D:
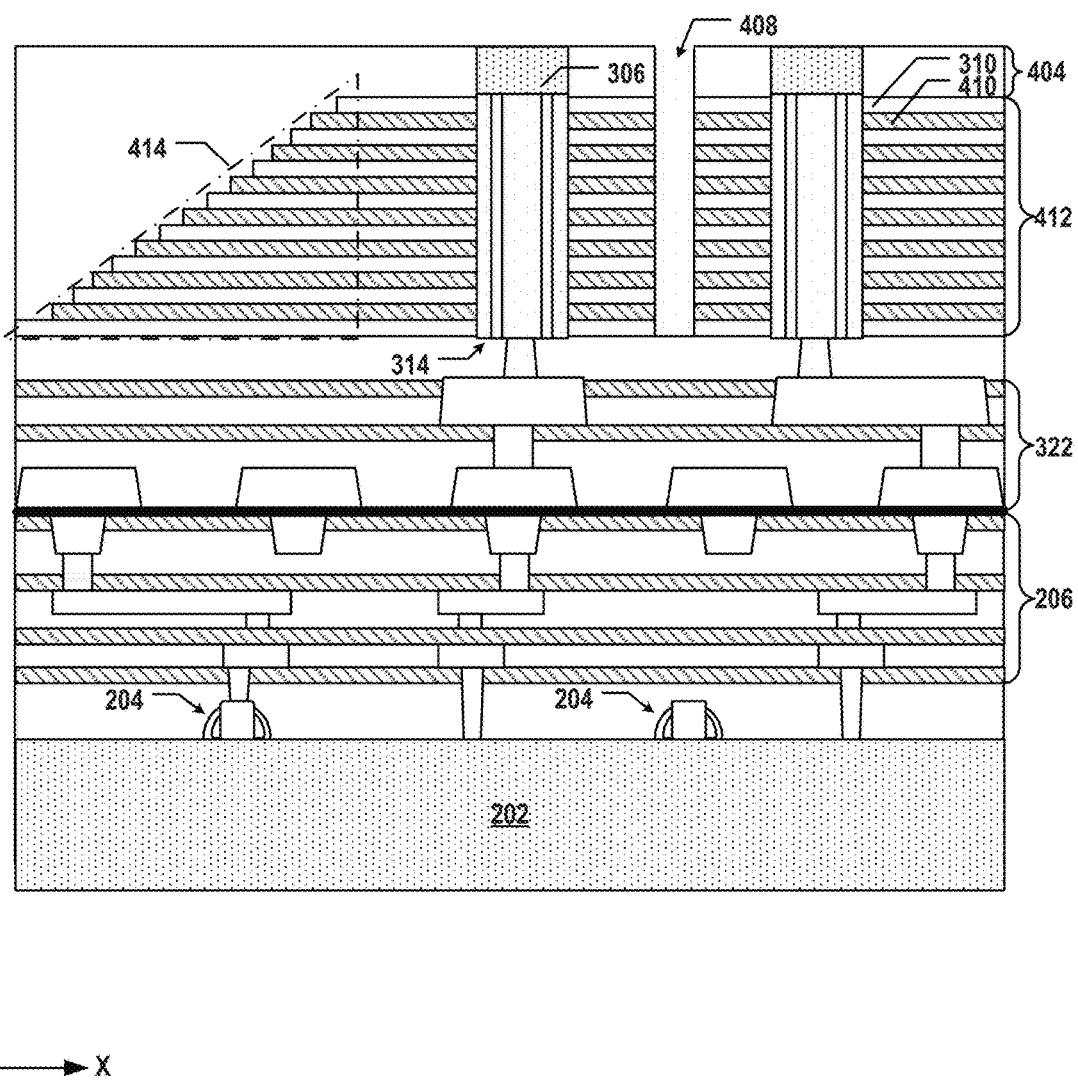

As illustrated in FIG. 4D, a GLS 408 is formed through single crystalline silicon layer 404 and the dielectric/sacrificial layer pairs of dielectric stack 308. GLS 408 can be patterned and etched by wet etch and/or dry etch. Each sacrificial layer 312 (shown in FIG. 4C) of dielectric stack 308 then can be etched through GLS 408, and conductor layers 410 can be deposited through GLS 408. That is, each sacrificial layer 312 of dielectric stack 308 can be replaced by conductor layer 410, thereby forming a plurality of conductor/dielectric layer pairs in a memory stack 412. The replacement of sacrificial layers 312 with conductor layers 410 can be performed by wet/dry etch of sacrificial layers 312 selective to dielectric layers 310 and filling the structure with conductor layers 410. Conductor layers 410 can include conductive materials including, but not limited to, W, Co, Cu, Al, doped silicon, polysilicon, silicides, or any combination thereof. Conductor layers 410 can be filled by thin film deposition processes, such as CVD, ALD, any other suitable process, or any combination thereof.

As a result, NAND memory strings 314 can each extend vertically through memory stack 412. In some embodiments, conductor layers 410 in memory stack 412 are used to form the select gates and word lines for NAND memory strings 314. At least some of conductor layers 410 in memory stack 412 (e.g., except the top and bottom conductor layers 410) can each be used as word lines of NAND memory strings 314. As a result of the gate replacement, a staircase structure 414 can be formed at the edge of memory stack 412. The edges of the conductor/dielectric layer pairs in staircase structure 414 of memory stack 412 along the vertical direction away from silicon substrate 202 (the positive y-direction) can be staggered laterally toward NAND memory strings 314.

Figure 4E:
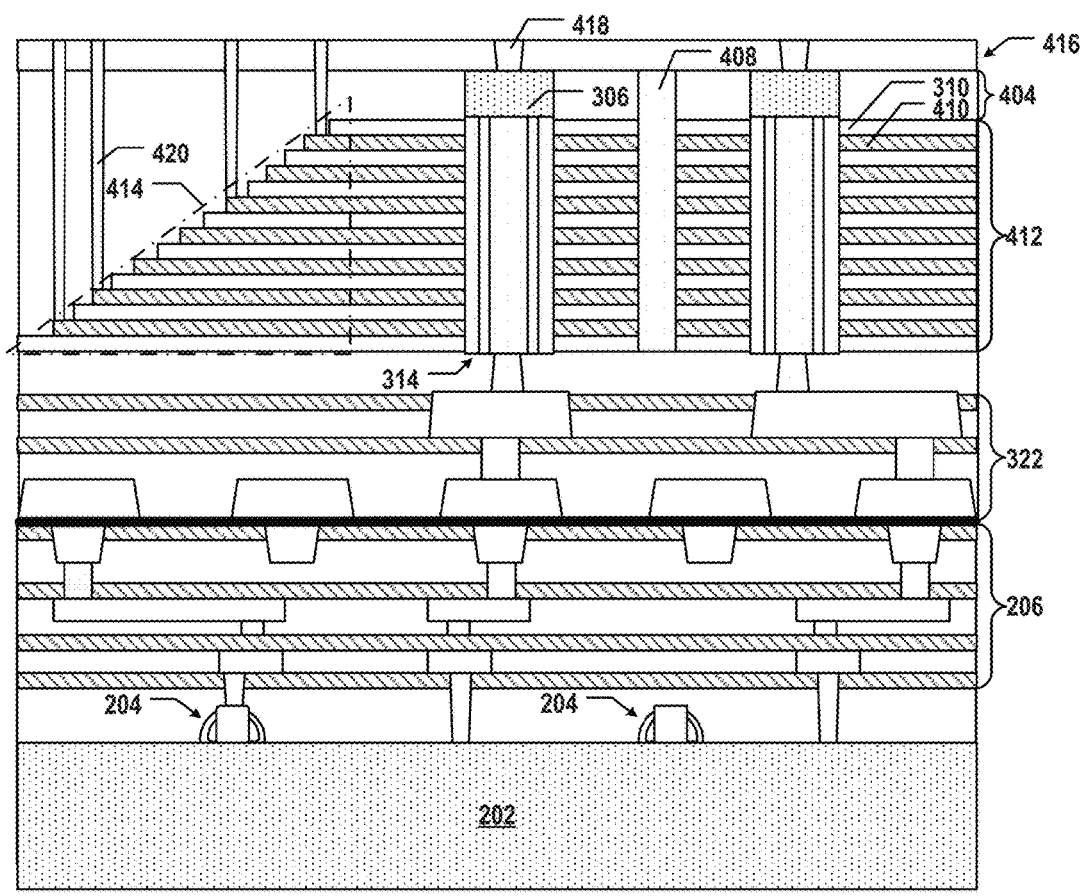

Method 700 proceeds to operation 712, as illustrated in FIG. 7, in which local interconnects of the memory stack and memory strings are formed. The local interconnects can include word line via contacts formed above the staircase structure of the memory stack and include source line via contacts formed above the memory strings. As illustrated in FIG. 4E, an ILD layer 416 can be formed on single crystalline silicon layer 404 by a thin film deposition process, such as CVD, ALD, any other suitable process, or any combination thereof, of a dielectric material. Source line via contacts 418 can be formed through ILD layer 416 and in contact with silicon plugs 306 of memory strings 314, respectively. Each source line via contact 418 can have its lower end in contact with the upper end of corresponding NAND memory string 314. Word line via contacts 420 are formed through one or more ILD layers (including ILD layer 416) and above staircase structure 414 of memory stack 412, according to some embodiments. The lower end of word line via contact 420 can land on a word line of NAND memory strings 314 (e.g., conductor layer 410) in staircase structure 414 of memory stack 412, such that each word line via contact 420 is above and in contact with corresponding conductor layer 410.

In some embodiments, fabrication processes to form source line via contacts 418 and word line via contacts 420 include forming vertical openings using a dry/wet etch process, followed by filling the openings with conductive materials and other materials (e.g., a barrier layer, an adhesion layer, and/or a seed layer) for conductor filling, adhesion, and/or other purposes. Source line via contacts 418 and word line via contacts 420 can include conductive materials including, but not limited to, W, Co, Cu, Al, doped silicon, silicides, or any combination thereof. The openings of source line via contacts 418 and word line via contacts 420 can be filled with conductive materials and other materials by ALD, CVD, PVD, electroplating, any other suitable processes, or any combination thereof. In some embodiments, GLS 408 can be filled with dielectric materials including, but not limited to, silicon oxide, silicon nitride, silicon oxynitride, or any combination thereof, by CVD, PVD, ALD, any other suitable processes, or any combination thereof.

Figure 4F:
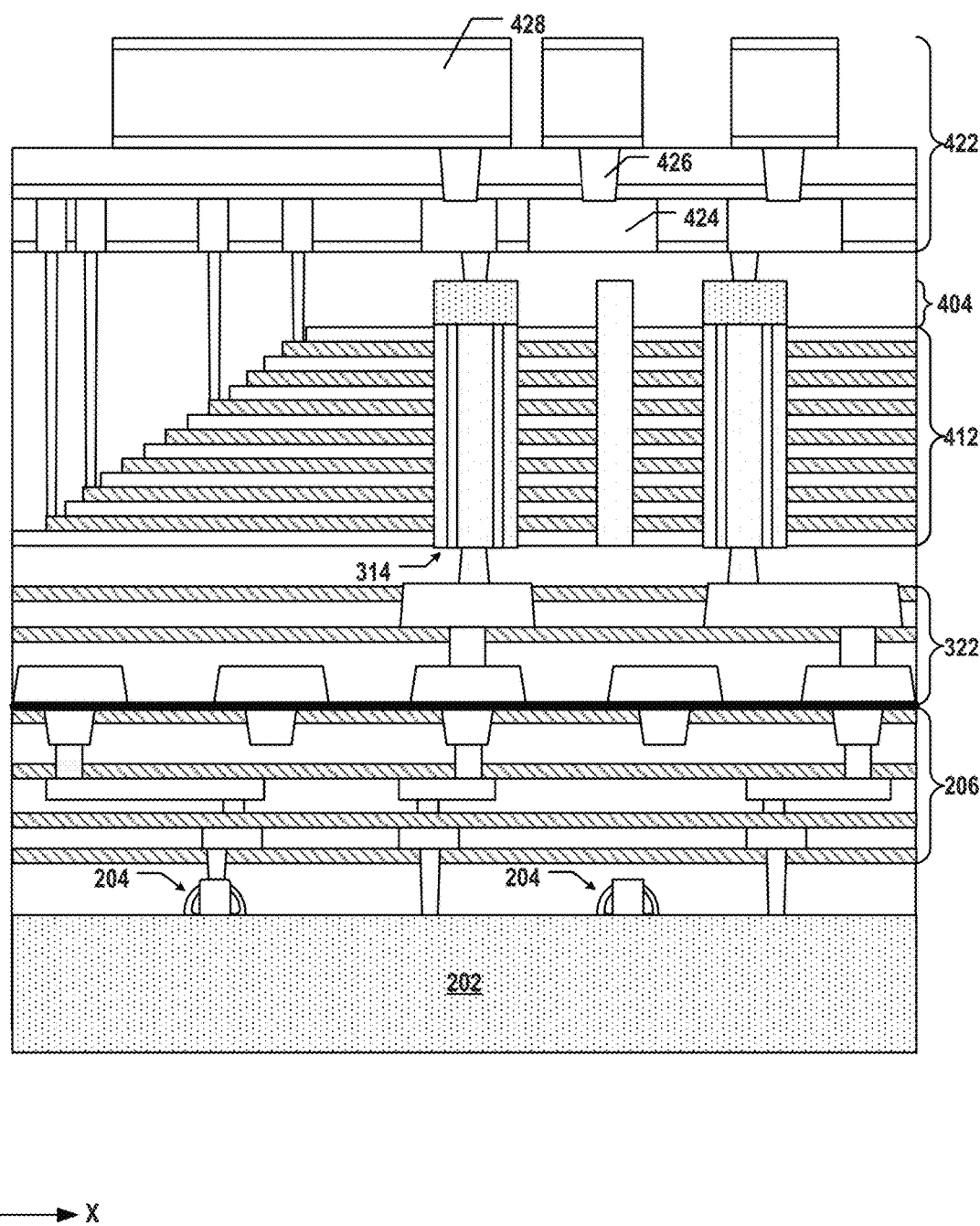

Method 700 proceeds to operation 714, as illustrated in FIG. 7, in which a third interconnect layer (e.g., a BEOL interconnect layer) is formed above the thinned second substrate. The BEOL interconnect layer can include a third plurality of interconnects in one or more ILD layers. As illustrated in FIG. 4F, a BEOL interconnect layer 422 can be formed above single crystalline silicon layer 404 and NAND memory strings 314. BEOL interconnect layer 422 can include interconnects, including interconnect lines 424 and via contacts 426 in one or more ILD layers for transferring electrical signals to and from the 3D memory device. In some embodiments, contact pads 428 and a redistribution layer (not shown) can be formed at the top surface of BEOL interconnect layer 422 for wire bonding and/or bonding with an interposer.

In some embodiments, BEOL interconnect layer 422 includes multiple ILD layers and interconnects therein formed in multiple processes. For example, interconnect lines 424, via contacts 426, and contact pads 428 can include conductive materials deposited by one or more thin film deposition processes including, but not limited to, CVD, PVD, ALD, electroplating, electroless plating, or any combination thereof. Fabrication processes to form interconnect lines 424, via contacts 426, and contact pads 428 can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 4F can be collectively referred to as an "interconnect layer" (e.g., BEOL interconnect layer 422).

Although not shown, in some embodiments, prior to the bonding, a TAC is formed extending vertically through dielectric stack 308 and in contact with the interconnects in array interconnect layer 322. After the bonding, via contacts can be formed extending vertically through one or more ILD layers and in contact with the TAC, so that BEOL interconnect layer 422 can be electrically connected to periphery interconnect layer 206.

According to one aspect of the present disclosure, a 3D memory device includes a substrate, a peripheral device disposed on the substrate, a memory stack disposed above the peripheral device and including a plurality of conductor/dielectric layer pairs, and a plurality of memory strings. Each of the memory strings extends vertically through the memory stack and includes a drain select gate and a source select gate above the drain select gate. Edges of the conductor/dielectric layer pairs in a staircase structure of the memory stack along a vertical direction away from the substrate are staggered laterally toward the memory strings.

In some embodiments, the 3D memory device further includes a first interconnect layer disposed above the memory strings. The 3D memory device further includes a plurality of first via contacts, each of which includes a lower end in contact with a conductor layer in one of the conductor/dielectric layer pairs and an upper end in contact with the first interconnect layer, according to some embodiments.

In some embodiments, the 3D memory device further includes a bonding interface between the memory strings and the peripheral device. The 3D memory device further includes a second interconnect layer between the bonding interface and the peripheral device and a third interconnect layer between the bonding interface and the memory strings, according to some embodiments.

In some embodiments, the 3D memory device further includes a plurality of second via contacts below and in contact with the plurality of memory strings, respectively.

In some embodiments, each of the memory strings includes a semiconductor plug at an upper end of the memory string. The semiconductor plug includes a single crystalline silicon, according to some embodiments. In some embodiments, the 3D memory device further includes a plurality of third via contacts, each of which includes a lower end in contact with one of the semiconductor plugs and an upper end in contact with the first interconnect layer.

In some embodiments, each of the memory strings includes a semiconductor channel extending vertically through the conductor/dielectric layer pairs, a tunneling layer between the conductor/dielectric layer pairs and the semiconductor channel, and a storage layer between the tunneling layer and the conductor/dielectric layer pairs.

According to another aspect of the present disclosure, a 3D memory device includes a substrate, a peripheral device disposed on the substrate, a memory stack disposed above the peripheral device and including a plurality of conductor/dielectric layer pairs, a plurality of memory strings each extending vertically through the memory stack, a first interconnect layer disposed above the memory strings, a second interconnect layer disposed below the memory strings, a plurality of first via contacts, and a plurality of second via contacts. Each of the first via contacts includes a lower end in contact with a conductor layer in one of the conductor/dielectric layer pairs and an upper end in contact with the first interconnect layer. Each of the second via contacts includes a lower end in contact with the second interconnect layer and an upper end in contact with one of the memory strings.

In some embodiments, edges of the conductor/dielectric layer pairs in a staircase structure of the memory stack along a vertical direction away from the substrate are staggered laterally toward the memory strings.

In some embodiments, each of the memory strings includes a drain select gate and a source select gate above the drain select gate.

In some embodiments, the 3D memory device further includes a bonding interface between the second interconnect layer and the peripheral device.

In some embodiments, each of the memory strings includes a semiconductor plug at an upper end of the memory string. The semiconductor plug includes a single crystalline silicon, according to some embodiments. In some embodiments, the 3D memory device further includes a plurality of third via contacts, each of which includes a lower end in contact with one of the semiconductor plugs and an upper end in contact with the first interconnect layer.

In some embodiments, each of the memory strings includes a semiconductor channel extending vertically through the conductor/dielectric layer pairs, a tunneling layer between the conductor/dielectric layer pairs and the semiconductor channel, and a storage layer between the tunneling layer and the conductor/dielectric layer pairs.

According to still another aspect of the present disclosure, a 3D memory device includes a first semiconductor structure, a second semiconductor structure, and a bonding interface between the first and second semiconductor structures. The first semiconductor structure includes a plurality of memory strings each extending vertically and including a semiconductor plug at an upper end of the memory string, a first interconnect layer disposed above the memory strings, a second interconnect layer disposed below the memory strings, and a plurality of first via contacts. Each of the first via contacts includes a lower end in contact with one of the semiconductor plugs and an upper end in contact with the first interconnect layer. The second semiconductor structure includes a substrate, a peripheral device disposed on the substrate, and a third interconnect layer disposed above the peripheral device. The second interconnect layer contacts the third interconnect layer at the bonding interface.

In some embodiments, the semiconductor plug includes a single crystalline silicon.

In some embodiments, each of the memory strings further includes a drain select gate and a source select gate above the drain select gate.

In some embodiments, the 3D memory device further includes a memory stack through which the memory strings extend vertically and including a plurality of conductor/dielectric layer pairs. Edges of the conductor/dielectric layer pairs in a staircase structure of the memory stack along a vertical direction away from the substrate are staggered laterally toward the memory strings.

In some embodiments, each of the memory strings includes a semiconductor channel extending vertically through the conductor/dielectric layer pairs, a tunneling layer between the conductor/dielectric layer pairs and the semiconductor channel, and a storage layer between the tunneling layer and the conductor/dielectric layer pairs.

In some embodiments, the 3D memory device further includes a plurality of second via contacts, each of which includes a lower end in contact with a conductor layer in one of the conductor/dielectric layer pairs and an upper end in contact with the first interconnect layer. In some embodiments, the 3D memory device further includes a plurality of third via contacts, each of which includes a lower end in contact with the second interconnect layer and an upper end in contact with one of the memory strings.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a substrate;
   a peripheral device disposed on the substrate;
   a memory stack disposed above the peripheral device and comprising a plurality of conductor/dielectric layer pairs;
   a plurality of memory strings, each of the memory strings extending vertically through the memory stack and comprising a drain select gate and a source select gate above the drain select gate; and
   a single crystalline silicon plug disposed above and in contact with each memory string of the plurality of memory strings, wherein edges of the conductor/dielectric layer pairs in a staircase structure of the memory stack along a vertical direction away from the substrate are staggered laterally toward the memory strings;
   a plurality of bit line via contacts disposed below the memory stack and having an upper end in contact with a lower end of a corresponding memory string of the plurality of memory strings;
   a plurality word line via contacts disposed above and in contact with a corresponding conductor layer of the memory stack; and
   a plurality of source line via contacts disposed above the memory stack and having a lower end in contact with the corresponding memory string of the plurality of memory strings.

2. The 3D memory device of claim 1, further comprising a first interconnect layer disposed above the memory strings.

3. The 3D memory device of claim 1, further comprising a bonding interface between the memory strings and the peripheral device.

4. The 3D memory device of claim 3, further comprising a second interconnect layer between the bonding interface and the peripheral device and a third interconnect layer between the bonding interface and the memory strings.

5. The 3D memory device of claim 2, wherein each of the word line via contacts comprises a lower end in contact with the corresponding conductor layer in one of the conductor/dielectric layer pairs and an upper end in contact with the first interconnect layer.

6. The 3D memory device of claim 2, wherein each of the source line via contacts comprises a lower end in contact with one of the single crystalline silicon plugs and an upper end in contact with the first interconnect layer.

7. The 3D memory device of claim 1, wherein each of the memory strings comprises:
 a semiconductor channel extending vertically through the conductor/dielectric layer pairs;
 a tunneling layer between the conductor/dielectric layer pairs and the semiconductor channel; and
 a storage layer between the tunneling layer and the conductor/dielectric layer pairs.

8. A three-dimensional (3D) memory device, comprising:
 a substrate;
 a peripheral device disposed on the substrate;
 a memory stack disposed above the peripheral device and comprising a plurality of conductor/dielectric layer pairs;
 a plurality of memory strings, each of the memory strings extending vertically through the memory stack;
 a single crystalline silicon plug disposed above and in contact with each memory string of the plurality of memory strings;
 a first interconnect layer disposed above the single crystalline silicon plugs, and a second interconnect layer disposed below the memory strings;
 a plurality of word line via contacts, each of the word line via contacts comprising a lower end in contact with a conductor layer in one of the conductor/dielectric layer pairs and an upper end in contact with the first interconnect layer;
 a plurality of bit line via contacts, each of the bit line via contacts comprising a lower end in contact with the second interconnect layer and an upper end in contact with one of the memory strings; and
 a plurality of source line via contacts, wherein each of the source line via contacts comprises a lower end in contact with one of the single crystalline silicon plugs and an upper end in contact with the first interconnect layer.

9. The 3D memory device of claim 8, wherein edges of the conductor/dielectric layer pairs in a staircase structure of the memory stack along a vertical direction away from the substrate are staggered laterally toward the memory strings.

10. The 3D memory device of claim 8, wherein each of the memory strings comprises a drain select gate and a source select gate above the drain select gate.

11. The 3D memory device of claim 8, further comprising a bonding interface between the second interconnect layer and the peripheral device.

12. The 3D memory device of claim 8, wherein each of the memory strings comprises:
 a semiconductor channel extending vertically through the conductor/dielectric layer pairs;
 a tunneling layer between the conductor/dielectric layer pairs and the semiconductor channel; and
 a storage layer between the tunneling layer and the conductor/dielectric layer pairs.

13. A three-dimensional (3D) memory device, comprising:
 a first semiconductor structure, comprising:
  a plurality of memory strings, each of the memory strings extending vertically and comprising a single crystalline silicon plug at an upper end of the memory string;
  a first interconnect layer disposed above the single crystalline silicon plugs, and a second interconnect layer disposed below the memory strings;
  a plurality of source line via contacts, each of the source line via contacts comprising a lower end in contact with one of the single crystalline silicon plugs and an upper end in contact with the first interconnect layer; and
  a plurality of word line via contacts disposed above and in contact with a corresponding conductor layer of a given memory string of the plurality of memory strings;
 a second semiconductor structure, comprising:
  a substrate;
  a peripheral device disposed on the substrate; and
  a third interconnect layer disposed above the peripheral device; and
 a bonding interface between the first semiconductor structure and the second semiconductor structure, wherein the second interconnect layer contacts the third interconnect layer at the bonding interface.

14. The 3D memory device of claim 13, wherein each of the memory strings further comprises a drain select gate and a source select gate above the drain select gate.

15. The 3D memory device of claim 1, further comprising:
 a plurality of isolation regions above the plurality of memory strings and separating the single crystalline silicon plugs from one another.

16. The 3D memory device of claim 15, wherein the plurality of isolation regions comprise a same thickness as the single crystalline silicon plugs.

17. The 3D memory device of claim 1, further comprising:
 a plurality of source line via contacts, wherein a lower end of each source line via contact is in contact with a corresponding one of the single crystalline silicon plugs.

18. The 3D memory device of claim 1, further comprising:
 a plurality of word line via contacts extending from the memory stack in a first vertical direction; and
 a plurality of bit line via contacts extending from the memory stack in a second vertical direction opposite the first direction.

19. The 3D memory device of claim 3, wherein the bonding interface comprises a plurality of first bonding contacts and a first dielectric on a first side of the bonding interface and a second plurality of bonding contacts and a second dielectric on a second side of the bonding interface, wherein the first bonding contacts and the first dielectric are hybrid bonded to the second bonding contacts and the second dielectric at the bonding interface.

* * * * *